US010345409B2

(12) United States Patent
Eichner et al.

(10) Patent No.: US 10,345,409 B2
(45) Date of Patent: Jul. 9, 2019

(54) SYSTEM AND METHOD FOR SIMULTANEOUS MULTISLICE EXCITATION USING COMBINED MULTIBAND AND PERIODIC SLICE EXCITATION

(71) Applicant: The General Hospital Corporation, Boston, MA (US)

(72) Inventors: Cornelius Eichner, Charlestown, MA (US); Lawrence L. Wald, Cambridge, MA (US); Kawin Setsompop, Charleston, MA (US)

(73) Assignee: The General Hospital Corporation, Boston, MA (US)

( * ) Notice: Subject to any disclaimer, the term of this patent is extended or adjusted under 35 U.S.C. 154(b) by 111 days.

(21) Appl. No.: 15/115,252

(22) PCT Filed: Jan. 30, 2015

(86) PCT No.: PCT/US2015/013645
§ 371 (c)(1),
(2) Date: Jul. 28, 2016

(87) PCT Pub. No.: WO2015/116881
PCT Pub. Date: Aug. 6, 2015

(65) Prior Publication Data
US 2017/0010340 A1  Jan. 12, 2017

Related U.S. Application Data

(60) Provisional application No. 61/933,950, filed on Jan. 31, 2014.

(51) Int. Cl.
*G01R 33/483* (2006.01)
*G01R 33/36* (2006.01)
*G01R 33/28* (2006.01)

(52) U.S. Cl.
CPC ....... *G01R 33/4835* (2013.01); *G01R 33/288* (2013.01); *G01R 33/3607* (2013.01)

(58) Field of Classification Search
CPC ............ G01R 33/4835; G01R 33/4828; G01R 33/5611; G01R 33/5608; G01R 33/543
(Continued)

(56) References Cited

U.S. PATENT DOCUMENTS

2009/0302838 A1* 12/2009 Haas .................... G01R 33/483
324/307
2010/0134105 A1* 6/2010 Zelinski ............... G01R 33/288
324/309
(Continued)

OTHER PUBLICATIONS

Eichner, Cornelius, et al. "Slice accelerated diffusion-weighted imaging at ultra-high field strength." Magnetic resonance in medicine 71.4 (2014): 1518-1525.*
(Continued)

*Primary Examiner* — Christopher P McAndrew
(74) *Attorney, Agent, or Firm* — Quarles & Brady LLP

(57) ABSTRACT

Systems and methods for controlling a magnetic resonance imaging (MRI) system to simultaneously excite multiple different slice locations. A multiband (MB) radio frequency (RF) pulse waveform is combined with an RF pulse waveform that results in periodic excitation of the slice locations, such as a power independent of a number of slices (PINS) RF pulse waveform. Before combination, the MB RF pulse waveform is preferably transformed to traverse the excitation k-space trajectory defined by a plurality of slice-encoding gradient blips. The combined RF pulse waveform is used to generate an RF excitation field generated while the plurality of slice-encoding gradient blips are played out. The portions of the combined RF pulse associated with the MB RF pulse are played out during the gradient blips, and the
(Continued)

portions associated with the PINS RF pulse are played out between the gradient blips.

19 Claims, 9 Drawing Sheets

(58) Field of Classification Search
USPC .......................................................... 324/309
See application file for complete search history.

(56) References Cited

U.S. PATENT DOCUMENTS

2013/0057281 A1* 3/2013 Feiweier ............ G01R 33/4835
324/309
2013/0221962 A1* 8/2013 Fautz ................. G01R 33/5612
324/309

OTHER PUBLICATIONS

Eichner, Cornelius, et al. "Slice accelerated diffusion-weighted imaging at ultra-high field strength." Magnetic resonance in medicine 71.4 (2014): 1518-1525. (Year: 2014).*
International Search Report and Written Opinion for international application No. PCT/US2015/013645, dated Apr. 21, 2015.
Eichner et al., "Slice Accelerated Diffusion-Weighted Imaging at Ultra-High Field Strength", Magnetic Resonance in Medicine, Jun. 24, 2013, pp. 1-7.

* cited by examiner

PINS Slice Profile
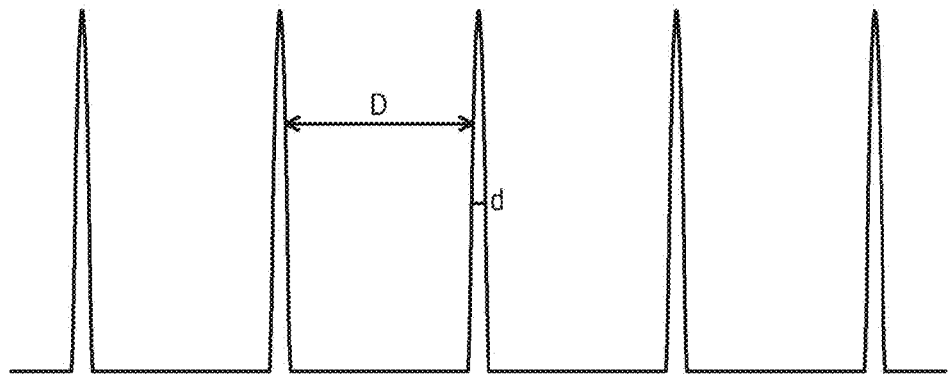
Multiband Slice Profile
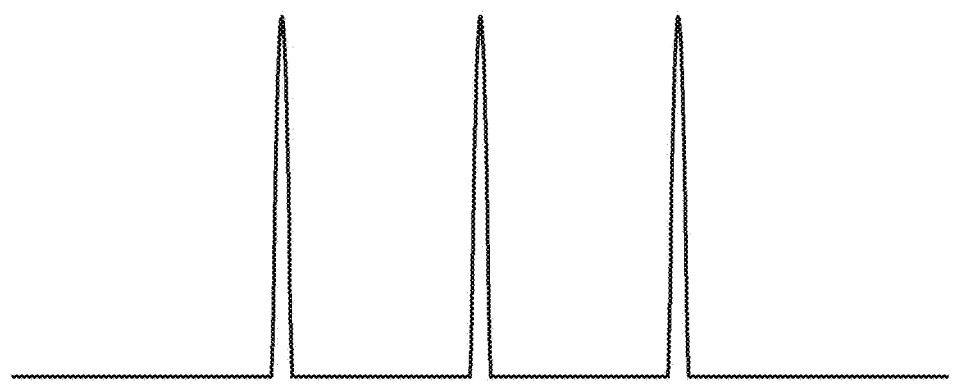
MultiPINS Slice Profile
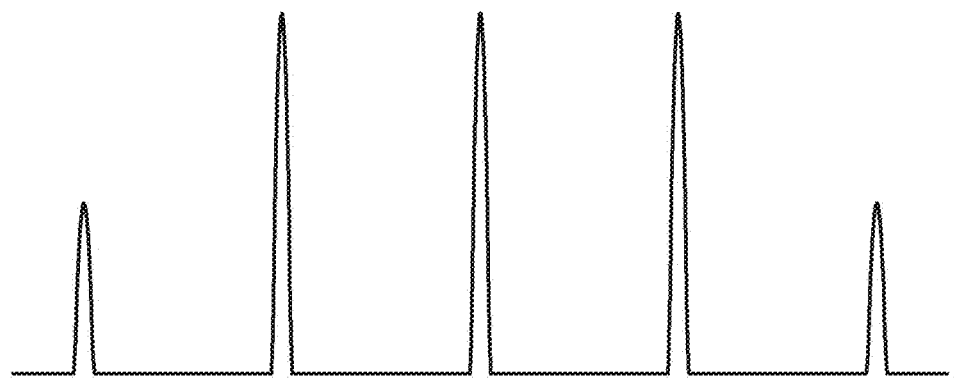
FIG. 4

SYSTEM AND METHOD FOR SIMULTANEOUS MULTISLICE EXCITATION USING COMBINED MULTIBAND AND PERIODIC SLICE EXCITATION

CROSS-REFERENCE TO RELATED APPLICATIONS

This application represents the U.S. National Stage of International Application No. PCT/US2015/013645, filed Jan. 30, 2015 which claims the benefit of U.S. Provisional Patent Application Ser. No. 61/933,950, filed on Jan. 31, 2014, and entitled "SYSTEM AND METHOD FOR SIMULTANEOUS MULTISLICE EXCITATION USING COMBINED MULTIBAND AND PERIODIC SLICE EXCITATION."

STATEMENT REGARDING FEDERALLY SPONSORED RESEARCH

This invention was made with government support under MH093765 and EB012107 awarded by the National Institutes of Health. The government has certain rights in the invention.

BACKGROUND

The present disclosure relates generally to systems and methods for magnetic resonance imaging (MRI) and, in particular, to systems and methods to low power simultaneous multi-slice excitation and refocusing.

MRI systems collect data in the Fourier transform representation of a scanned object and allow for non-invasive investigation of tissues with detailed contrast. Two-dimensional (2D) imaging is inherently slow since it generally involves a sequential acquisition of multiple slices that form a region of interest, wherein the total imaging time is proportional to the number of slices acquired. As a result, simultaneous multi-slice (SMS) MR imaging has gained much attention during the last several years. Its basic principle is to concurrently excite and record multiple imaging slices and subsequently use parallel imaging techniques to unfold the resulting overlapping images. This has enabled significant increase in temporal efficiency of 2D imaging acquisitions, especially for SMS echo-planar imaging (EPI), which has been proven to be a reliable method for functional and diffusion MRI.

A first step in SMS imaging is to excite a number of multiple slices at the same time. A conventional approach for creating such a multi-band (MB) excitation pattern involves summing up several single-slice radiofrequency (RF) pulses with different phase slopes (FIG. 1). The superimposed RF waveform then leads to slice excitations at multiple chosen locations. However, a major side effect of the summation is a linear growth of transmitted energy and peak power with the number of simultaneously excited slices. Such increase in energy and peak power limits full usability of MB pulses at high field strengths, particularly, for example, for spin-echo based acquisitions at 7 Tesla.

Some attempts to reduce the peak RF power of a multi-band pulse have included introducing an optimized phase term for each of the summed up RF pulses. Other strategies have implemented a time shifting approach for the RF pulse. However, both of these approaches only decrease the peak RF power and not the total energy transmission. By contrast, an alternative approach aimed to reduce both the peak RF and the total energy transmission has been to employ a variable rate selective excitation (VERSE) algorithm. However this method can be limited by pulse duration constraints and susceptibility gradients between different tissues, which can overlay weak slice selection gradients and therefore distort and shift slice profiles. Therefore, at ultra high field strength, the VERSE algorithm cannot reduce RF energy of a MB pulse sufficiently to create a high flip angle pulse with a large multi-band factor.

Recently a RF pulse type was introduced for periodic slice excitation of multiple slices, namely a power independent of number of slices (PINS) pulse, whereby a periodic slice excitation pattern is created by a constant under-sampling of a single slice RF pulse in k-space. Specifically, PINS pulses do not have a continuous RF and gradient waveform, but consist of alternating rectangular sub-pulses played out in between gradient blips (FIG. 1). This results in the excitation of periodic slice excitation ghosts, which is independent of the chosen number of slices. Therefore, in contrast to MB pulses, the RF energy of PINS pulses does not increase with a higher number of excited slices and so the energy transmission is generally lower than that of corresponding MB pulses. This distinct feature makes PINS pulses applicable to ultra-high magnetic field applications, where specific absorption rate (SAR) constraints, defined as the RF power absorbed per unit of mass of an object, can potentially limit the capability of SMS technology. As such, periodic PINS excitation has been successfully employed to enable both slice accelerated spin echo functional MRI and slice accelerated high-resolution diffusion MRI at 7 T.

However, although PINS pulses effectively enable slice acceleration at high field strengths, there are several drawbacks to this method. In particular, the composition of PINS pulses from rectangular RF sub-pulses, played out using non-constant gradient blips, prevents a fast traversal of excitation k-space. Due to physiological gradient slew rate limitations; it is not possible to speed up the gradient blips significantly, which results in a slow k-space traversal and high sensitivity to off-resonance effects, causing excitation shifts along the slice direction. One way to speed up k-space traversal is to shorten their RF sub-pulses. However, since the RF sub-pulses are only applied during a relatively small portion of the total PINS pulse duration, a large reduction in their length necessitates a large increase in the RF sub pulses' amplitudes. Yet since pulse amplitudes are restricted by RF amplifiers and by SAR constraints, this places limitations on possible reductions in RF sub-pulse durations.

Therefore, given the above shortcomings, there is a need for magnetic resonance imaging systems and methods including low power simultaneous multi-slice excitation and refocusing.

SUMMARY

The present invention overcomes the drawbacks of aforementioned technologies by providing a magnetic resonance imaging (MRI) system and method for controlling the MRI system, employing a novel RF pulse waveform directed to minimizing energy deposition and controlling a pulse duration in a manner that can reduce off-resonance effects on an excited slice profile.

It is an aspect of the invention to provide systems and methods for controlling an MRI system to generate an RF excitation field that simultaneously excites spins in multiple different slice locations. A multiband (MB) RF pulse waveform that is associated with excitation of multiple different slice locations is selected. An RF pulse waveform that includes a plurality of sub-pulses spaced apart in time is also selected. This RF pulse waveform is associated with a periodic excitation of the multiple different slice locations. As an example, the RF pulse waveform is a power independent of a number of slices (PINS) RF pulse waveform. A gradient waveform that defines a plurality of gradient blips to be played out between the plurality of sub-pulses in the PINS RF pulse waveform is selected. A combined RF pulse waveform is generated by combining the MB RF pulse waveform and the PINS RF pulse waveform. As an example the MB RF pulse waveform is first transformed to a reshaped MB RF pulse waveform that traverses the same excitation k-space trajectory as the PINS RF pulse waveform, as defined by the selected gradient waveform. An MRI system is directed to generate an RF excitation field that simultaneously excites spins in the multiple different slice locations using the combined RF pulse waveform and the selected gradient waveform.

The foregoing and other advantages of the invention will appear from the following description.

BRIEF DESCRIPTION OF THE DRAWINGS

FIG. 4 is a graphical illustration comparing slice profiles for the PINS, MB, and MultiPINS RF pulse excitations;

DETAILED DESCRIPTION

Simultaneous multi-slice (SMS) acquisition in magnetic resonance imaging (MRI) enables a large increase in temporal efficiency such as, for example, in the case of echoplanar imaging (EPI)-based acquisitions. A multi-band (MB) RF pulse excitation is generally employed to excite and refocus spins in multiple excitation slices concurrently. In particular, with the advent of high channel count receive arrays, the number of simultaneously excited slices in SMS imaging, described by a MB factor, can increase up to ten or more, thereby allowing for rapid data acquisition. However, MB RF pulses can lead to large energy deposition in a scanned subject since the energy deposition grows linearly with the number of simultaneously excited slices. Specifically when using high magnetic field strengths, energy deposition is higher, often necessitating cool down periods during acquisition, which significantly limit SMS imaging capabilities.

By contrast, an RF pulse that generates a periodic excitation, such as a power independent of the number of slices (PINS) pulse, allows for reduced RF energy deposition, albeit at the cost of increased off-resonance dependency and lower RF pulse bandwidths. In particular, the PINS RF pulse forms an infinite periodic excitation pattern by under-sampling excitation k-space with discrete RF power deposition. This is achieved by replacing a smooth RF curve with rectangular RF sub-pulses and a constant slice-select gradient described by blips played out between the RF sub-pulses. In addition to high sensitivity to off-resonance effects, the energy deposition of PINS RF pulses increases dramatically if short RF sub-pulses are employed to reduce such effects.

Described here are systems and methods for generating RF pulses that have a reduction in energy deposition compared to MB RF pulses, and that also overcome the shortcomings of the PINS pulse design. The RF pulses generated by the systems and methods of the present invention include an RF pulse waveform suitable for simultaneous multi-slice MRI, and are generated using a mixing ratio of advantageous portions, features, or elements of MB and PINS RF pulse waveforms.

In some embodiments, a MB RF pulse waveform and a PINS RF pulse waveform are advantageously combined to formulate a distinct RF pulse waveform type suitable for SMS imaging, herein referred to as a "MultiPINS" pulse. By providing a mixing ratio of portions, features or elements from both a MB and a PINS pulse excitation, energy transmission for a MultiPINS excitation can be minimized, wherein a slice excitation for a desired multi-band factor is similar as compared to that of a MB or PINS excitation. It is possible to trade-off reduced energy transmission and lowered RF peak power from MultiPINS pulses with a shortened pulse duration without exceeding SAR limits, and hence reduce off-resonance effects on the excited slice profile.

Figure 1A:
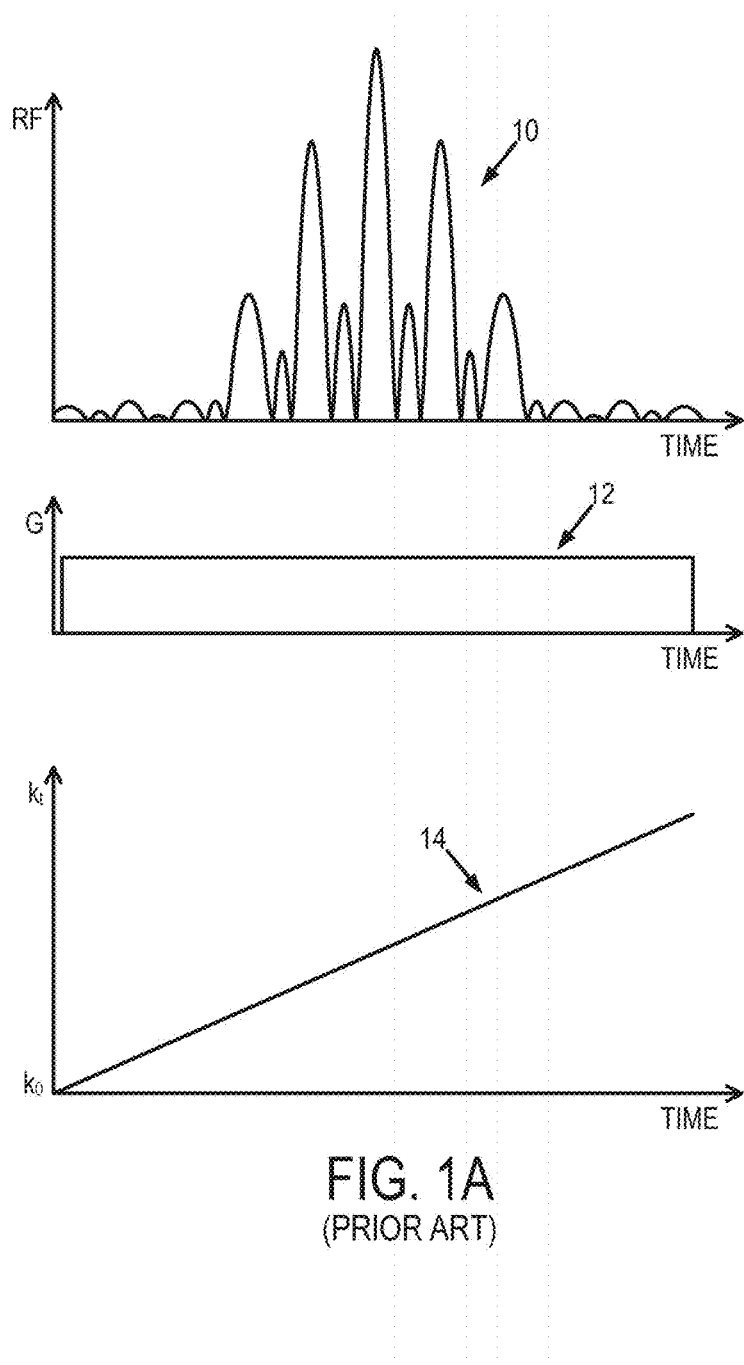
FIG. 1A illustrates an example of a multiband (MB) radio frequency (RF) excitation pulse, a slice-select gradient played out during the MB RF pulse, and an excitation k-space trajectory associated with the slice-select gradient.

Referring now to FIG. 1A, an example of a conventional MB RF pulse 10 is shown together with the constant slice-select gradient 12 that is played out during a spatially selective excitation. The basis for MB RF pulse excitation includes single slice RF pulses, $RF_{SS}(k)$, which are modulated with different phase slopes, in dependence of their slice position. Multi-band pulses are then created, by summing multiple RF pulses to form simultaneous slice excitations at different locations, according to:

$$RF_{MB}(k) = \Sigma RF_{SS}(k) e^{i2\pi k SlicePos} \tag{1};$$

Typically, during this excitation period, a constant gradient 12 is played out to form a linear traversal 14 of excitation k-space. The summation of different RF pulses typically does not alter the duration of the MB pulse 10 compared to its underlying single slice pulses.

Figure 1B:
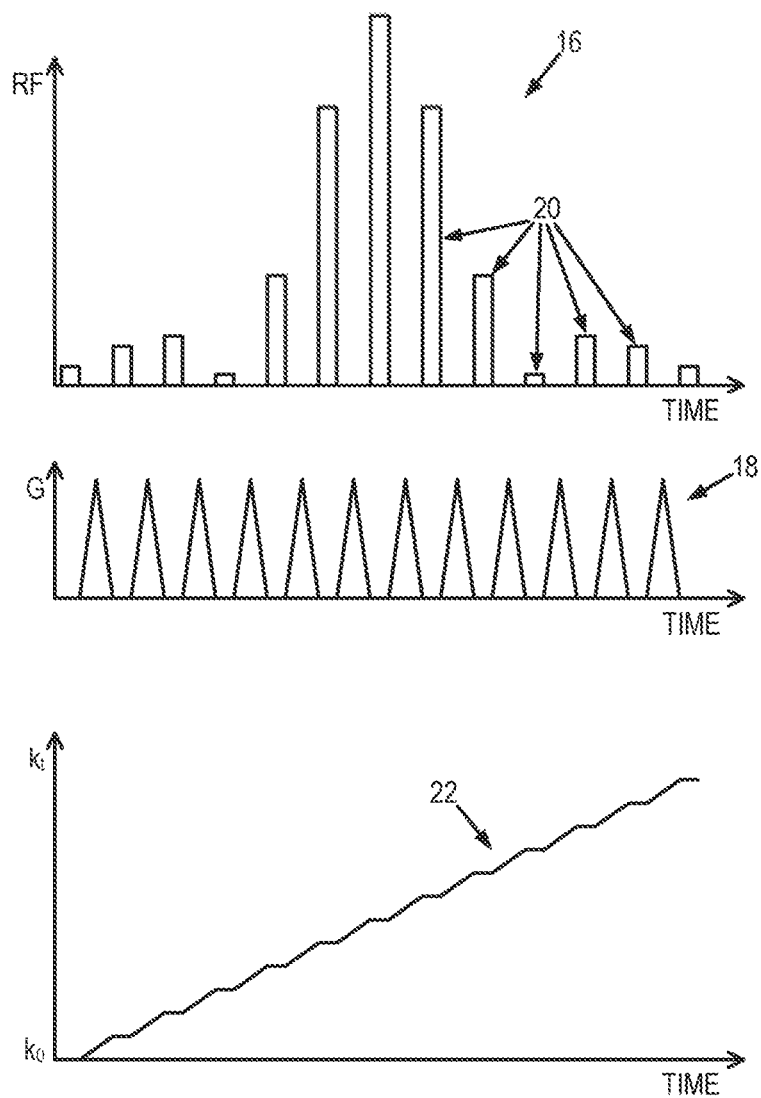
FIG. 1B illustrates an example of a power independent of the number of slices (PINS) radio frequency (RF) excitation pulse, a series of slice-select gradient blips played out between the sub-pulses of the PINS RF pulse, and a k-space trajectory associated with the slice-select gradient blips.

Referring now to FIG. 1B, an example of a conventional PINS RF pulse 16 is shown together with the sequence of slice-select gradient blips 18 that are played out between sub-pulses 20 of the PINS pulse 16 for a spatially selective excitation. In general, PINS pulses are created by multiplication of a single slice RF pulse with a Dirac Comb function. By doing so, a train of rectangular sub-pulses 20 of a specific length may be shaped. Additionally, the constant slice selection gradient used for MB RF pulse excitation is replaced with gradient blips 18, which are played out between the RF sub-pulses 20. The Dirac Comb sampling of the RF pulse in k-space results in an infinite periodic slice excitation, depositing discrete RF power.

The combination of a specific PINS RF pulse waveform 16 with a specific bandwidth time product (BWTP) and gradient waveform 18 relates to a particular periodic slice excitation pattern according to:

$$BWTP = N_{rf}\frac{d}{D}; \quad (2)$$

In this formula BWTP is a bandwidth time product of the pulse, $N_{rf}$ is the number of sub-pulses, d the slice thickness and D the inter-slice distance. The inter-slice distance is a function of the area under the gradient blips 18, $A_{blip}$, dependent on the gyromagnetic ratio γ:

$$A_{blip} = \frac{1}{\gamma D}; \quad (3)$$

In the case of PINS excitation, the gradient blips 18, which are played between RF sub-pulses 20, form a modulated linear trajectory 22 in excitation k-space.

The present invention recognizes that PINS and MB RF pulses with similar, or complementary, BWTP and slice thickness, d, navigate the same distance along $k_z$ according to:

$$k_t = \frac{BWTP}{d}; \quad (4)$$

where, $k_t$ represents the total amount of k-space coverage (see FIGS. 1A and 1B). Therefore, in one embodiment of the present invention, since both pulses cover the same gradient moment for a desired slice excitation, it may be desirable to transform the RF waveform of a MB pulse to follow the gradient course of a PINS RF waveform, namely $$RF_{MB}(k_{z\ MB}) \rightarrow RF_{MB}(k_{z\ PINS}) \quad (5);$$

Figure 2:
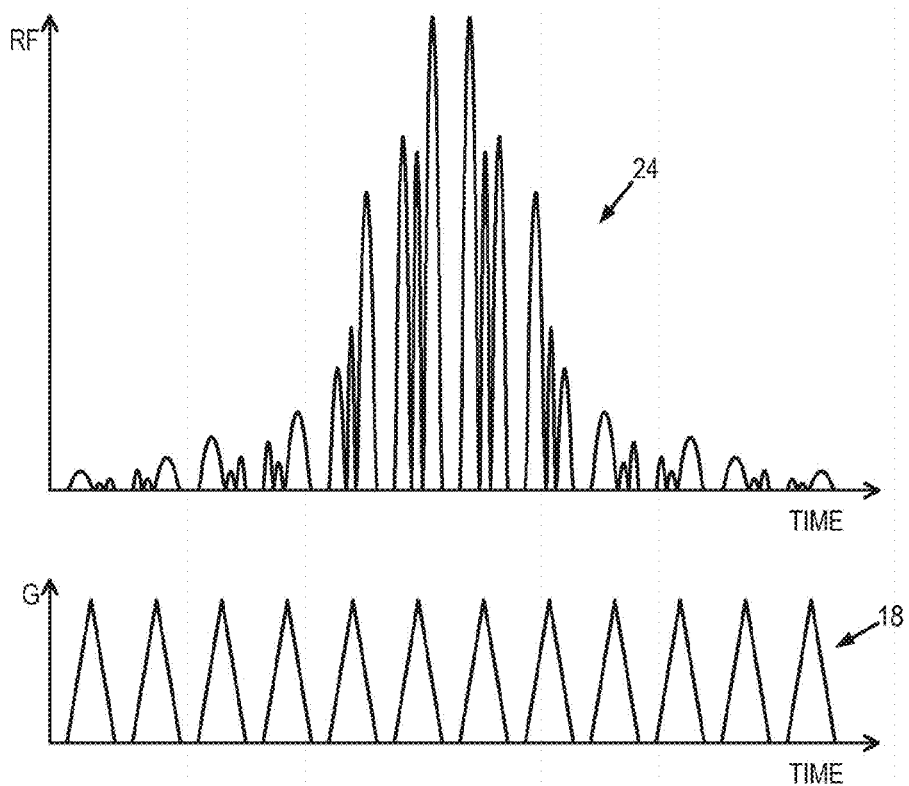
FIG. 2 illustrates an example of a reshaped MB RF pulse waveform generated by transforming an MB RF pulse waveform to traverse an excitation k-space trajectory defined by a series of gradient blips, and also illustrates an example of a series of gradient blips.

In some embodiments, this transformation may be performed by using a variable rate selective excitation approach, which generally takes advantage of the trade-off between duration and amplitude of a sample within an RF pulse waveform using a redistribution of the pulse area. Therefore, in some embodiments, such a transformation may be implemented by performing an interpolation of a MB RF pulse excitation, $RF_{MB}$, along with a scaling of the MB RF waveform with the gradient strength. An example of an MB RF pulse that has been so transformed is illustrated in FIG. 2. In this example, the resulting transformed MB RF pulse 24 follows the gradient waveform 18 utilized by a PINS pulse.

Figure 3:
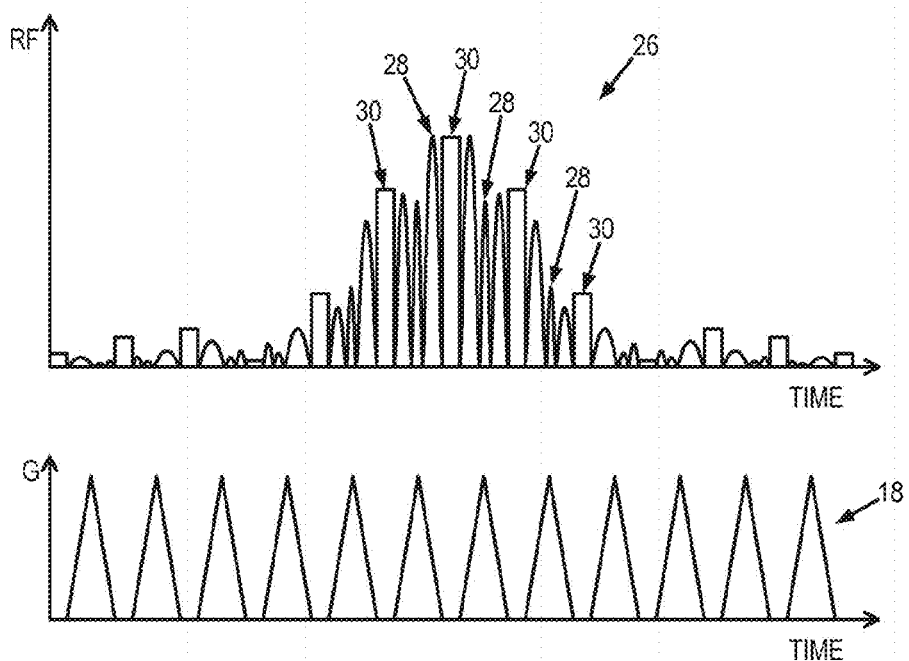
FIG. 3 illustrates an example of a MultiPINS RF pulse waveform generated by combining a reshaped MB RF pulse waveform and a PINS RF pulse waveform, and also illustrates an example of a series of gradient blips.

The transformed MB RF pulse waveform 24, as described above, may then be combined with a PINS RF pulse waveform to form a MultiPINS RF pulse waveform. An example of such a MultiPINS RF pulse waveform 26 and the associated gradient blips 18 are illustrated in FIG. 3. The portions 30 of the MultiPINS RF pulse 26 that are associated with the original PINS pulse are played out between the gradient blips, while the portions 28 of the MultiPINS RF pulse 26 that are associated with the transformed MB RF pulse are played during the gradient blips. The transformed MB RF pulse and the PINS RF pulse are preferably combined using a mixing ratio that balances the features of the MB and PINS pulses. As such, a MultiPINS RF pulse waveform with mixing ratio M between PINS and MB pulses may be represented as:

$$RF_{MultiPINS} = M*RF_{MB} + (1-M)*RF_{PINS} \quad (6);$$

As shown, the mixing ratio M, may be selected or optimized, using any systems or methods configured to do so, to have a value in a range between 0% to 100%, wherein 0% represents a pure PINS pulse and 100% represents a pure MB pulse. In some aspects, the mixing ratio M may be selected or optimized in cooperation with a duration of RF sub-pulses of a PINS pulse excitation in order to minimize RF energy transmission.

The resulting slice profile of a MultiPINS RF pulse waveform, as described, in comparison to those of the PINS and MB RF pulse excitation, can be seen in examples shown in FIG. 4. In particular, a PINS portion of the combined pulse creates a slice excitation at periodic locations, whereas a MB portion affects only a specific number of slices at chosen locations. As a result, the distinct interaction of both pulse portions creates a fully excited slice profile at locations within a region of interest and partially excited slices at periodic locations outside the region of interest.

From FIG. 1B and FIG. 2, it can be appreciated that gradient waveforms of both the PINS RF pulse waveform and the reshaped MB RF pulse waveform, as described above, are alike, following the same $k_z$ trajectory. However, their energy is deposited at different points in excitation k-space. In addition, the energy deposition of the MB RF pulse waveform does not follow a straight linear slope, but rather a linear slope with minor sinusoidal modulations. Although this may lead to slice profile distortions that differ between MB and PINS components of the MultiPINS RF pulse waveform at offset frequencies, simulations indicate that this is generally not an issue since the energy deposition trajectories of the excitations are only marginally different.

Figure 5:
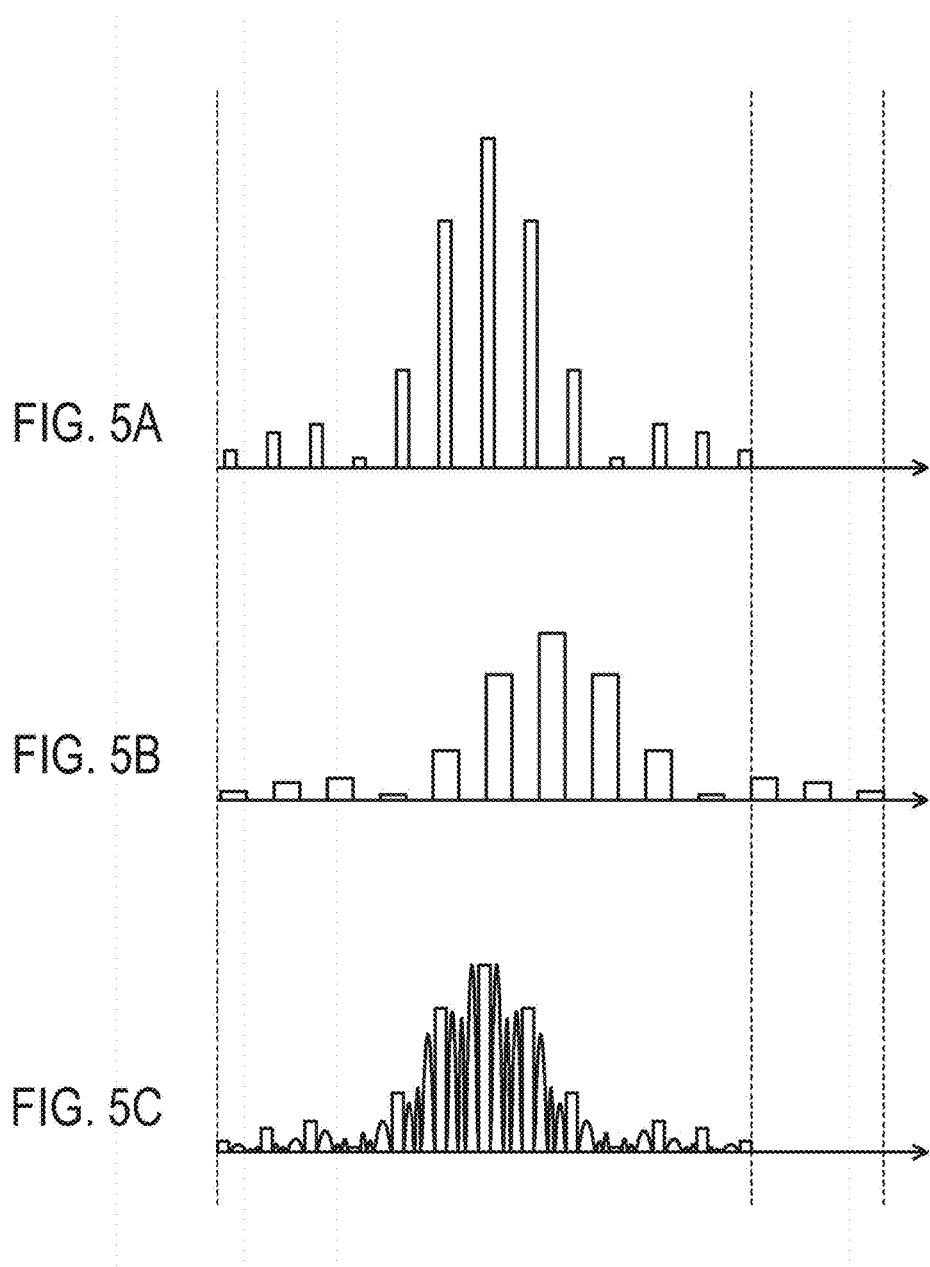
FIGS. 5A-5C are graphical illustrations comparing RF amplitude and pulse duration for the PINS and MultiPINS RF pulse excitations.

Turning to FIGS. 5A-5C, different pulse configurations are shown to illustrate advantages of a MultiPINS RF pulse waveform over prior approaches, in accordance with the present invention. For example, typically, the absorbed energy associated with a PINS pulse is altered by modifying sub-pulse durations, resulting in altered RF amplitudes. This change can affect the RF power deposition, as well as total pulse duration (FIG. 5A, 5B), which may be undesirable in some cases. By contrast, a MultiPINS RF pulse waveform is formed by selecting or optimizing the mixing ratio parameter M, which also allows for RF energy to be transmitted during gradient blips of the pulse. In this manner, as shown in FIG. 5C, the RF amplitude of the MultiPINS RF pulse waveform may be reduced without affecting its duration, unlike a pure PINS RF pulse waveform (shown in FIG. 5A) as stated above. Therefore, the mixing ratio parameter of a MultiPINS RF pulse waveform bears no direct influence on the sub-pulse duration or the total pulse duration, allowing for a modification in RF amplitude, which may provide advantageous benefits in relation to power transmission to an imaged object because the RF transmitted energy is dependent on the square of the RF amplitude.

By using the gradient blips as additional time points for excitation, the total RF energy transmission of the MultiPINS RF pulse waveform may be spread out over the total pulse duration. Thus, since the energy of an RF pulse depends on its square amplitude, a more spread out waveform results in lower SAR. Therefore, in some aspects, the total energy transmission of any specific MultiPINS RF pulse waveform may be represented as a two-dimensional function, in dependence of a sub-pulse duration and mixing ratio M, either of which may be modified for any given excitation specification or condition.

Figure 6:
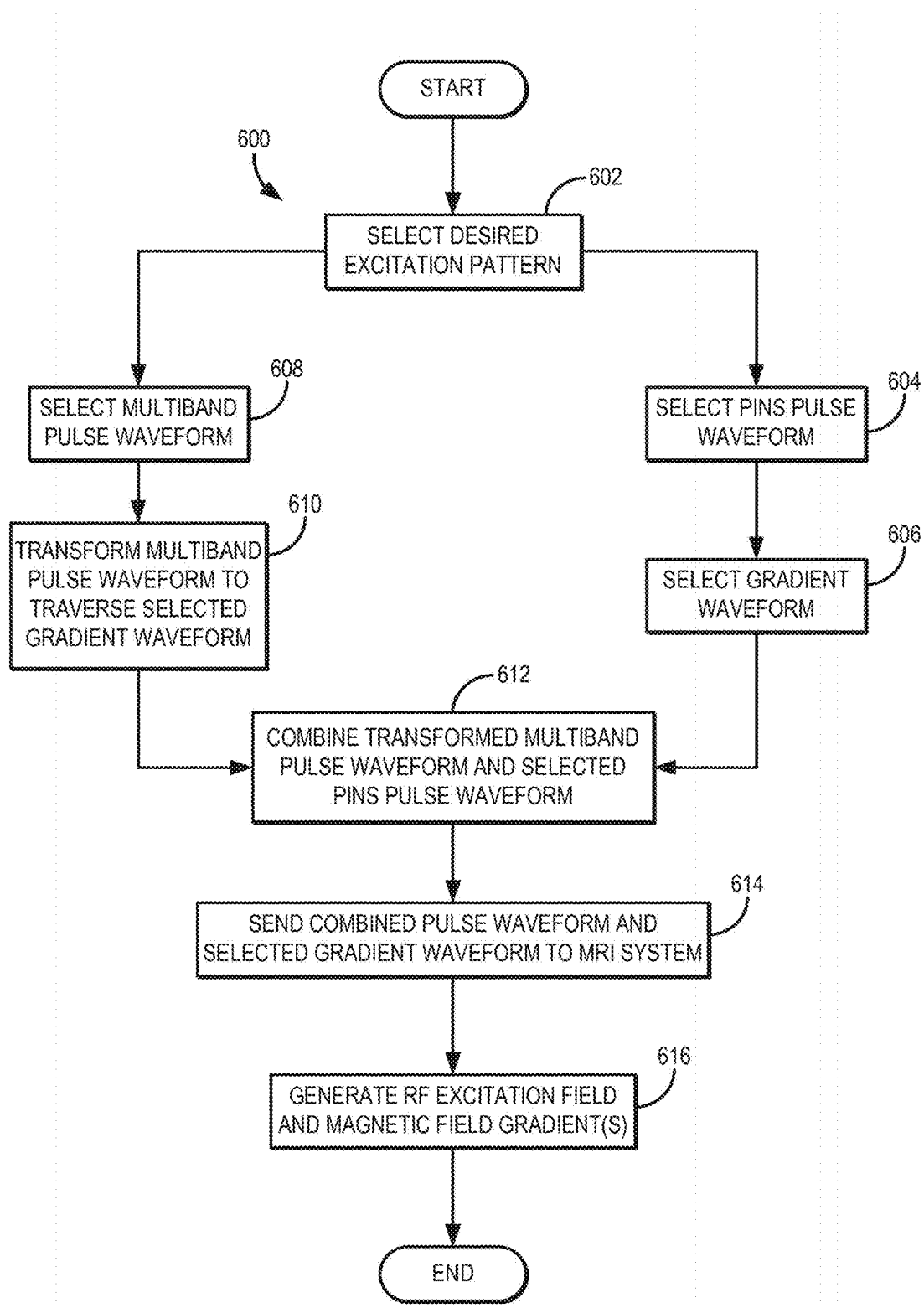
FIG. 6 is a flowchart setting forth steps of generating a MultiPINS RF pulse waveform and using that RF pulse waveform to direct an MRI system to generate an RF excitation field.

Turning to FIG. 6, a process 600 is illustrated setting forth steps of an example of a method for generating a MultiPINS RF pulse waveform and utilizing that pulse waveform to direct an MRI system to excite a plurality of slice locations in a subject. The process generally begins with the selection of a desired excitation pattern, as indicated at step 602. As an example, selecting the desired excitation pattern may include selecting the number of slices to simultaneously excite, as well as their physical locations. The desired slice excitation is then used to generate the RF pulse waveforms that will be combined to form the MultiPINS RF pulse waveform.

In a first processing branch, an RF pulse waveform that provides periodic excitation is selected, based on the desired excitation, as indicated at step 604. As an example, this RF pulse waveform is a power independent of a number of slices (PINS) RF pulse waveform. Next, a gradient waveform associated with this RF pulse is selected, as indicated at step 606. For instance, the gradient waveform includes a plurality of slice-encoding gradient blips, as described above.

In a second processing branch, a conventional multiband (MB) RF pulse waveform is selected, based on the desired excitation, as indicated at step 608. In some preferred aspects, the MB and PINS RF pulse waveforms include similar excitation parameters, such as slice thickness, inter-slice distance, and BWTP. This MB RF pulse waveform is then transformed to traverse the excitation k-space trajectory defined by the selected gradient waveform, as indicated at step 610. This process is described above, but may include interpolating and scaling the MB RF pulse waveform such that it deposits energy along the excitation k-space traversed by the selected gradient waveform.

The transformed MB RF pulse waveform and the selected PINS pulse waveform are then combined, as indicated at step 612. The resulting MultiPINS RF pulse waveform includes portions associated with the transformed MB pulse waveform and portions associated with the PINS pulse waveform. Preferably, the transformed MB pulse waveform and the PINS pulse waveform are combined using a mixing ratio, as described above in detail.

Figure 7:
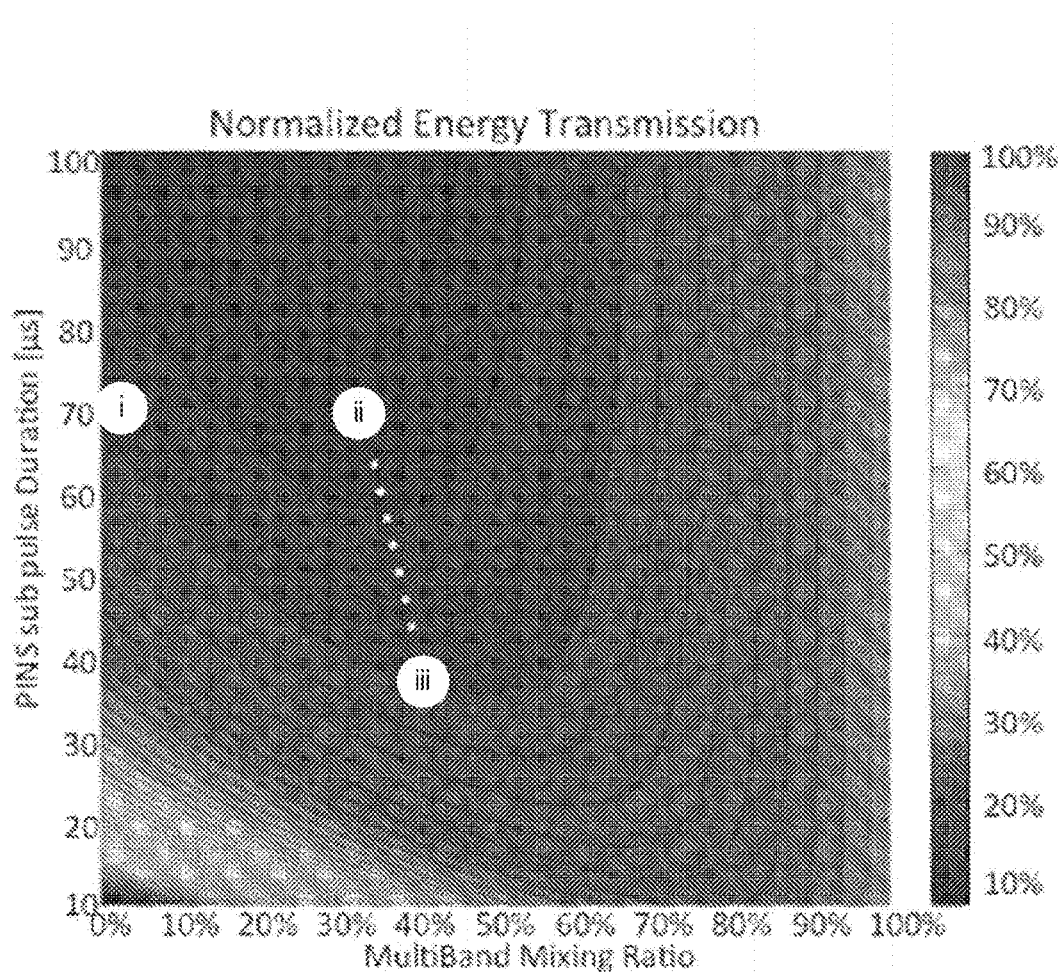
FIG. 7 is a graphical illustration of normalized energy transmission as a function of a MultiPINS MB mixing ratio and PINS RF sub-pulse duration.

In some embodiments, a map, or matrix of a total energy transmission, such as the one illustrated in FIG. 7, may be formulated as a function of a PINS sub-pulse duration and mixing ratio, M, to facilitate a selection of parameters describing a MultiPINS RF pulse waveform for a given excitation criteria. As shown in the simulated example FIG. 7, it may be appreciated that for some cases, modifying a RF sub-pulse duration or MB mixing ratio in accordance with a map of the total energy transmission may optimize energy deposition within an imaged object. For example, starting from a standard PINS pulse (case i), it may possible to minimize the transmitted energy by increasing the MB mixing ratio (case ii) using the same RF sub-pulse duration, or it may be possible to keep the energy constant while reducing the RF sub-pulse duration (case iii), and therefore reducing influences of off-resonance effects. In this example, a transition from case (ii) to case (i) results in a forty percent energy increase. The transition from (i) to (iii) does not change the RF power, but significantly shortens the RF pulse in duration. This results in a lower off-resonance dependency and therefore an increase in the signal level of eight percent at 100 Hz off-resonance. In both calculated MultiPINS (cases (ii) and (iii)), the energy efficiency of the MultiPINS RF pulse exceeds energy efficiency of the standard PINS RF pulse. Therefore, at process block 610, it is furthermore possible to trade off between energy reduction and better off-resonance behavior by choosing different configurations, such as between (ii) and (iii) in the example energy matrix of FIG. 7. In some aspects, reductions in transmit energy and off-resonance sensitivity of the MultiPINS RF pulse can be achieved without changing the slice profile behavior.

Returning to FIG. 6, at process block 614, the MultiPINS RF pulse waveform and the selected gradient waveform are provided to an MRI system. Then, as process block 616 the MRI system utilizes the MultiPINS RF pulse waveform and the selected gradient waveform to generate an RF excitation field that excites the multiple slice locations defined by the original MB RF pulse waveform and the PINS pulse waveform. From the data acquired following this excitation, images of the excited slices can be reconstructed.

The systems and methods described here benefit from judicious combinations of aspects, elements and features of PINS and MB RF pulse waveforms to construct a MultiPINS RF pulse waveform that offers increased control over energy and pulse timing compared to other approaches. As such, the present invention is applicable to a variety of magnetic resonance imaging techniques and approaches, such as diffusion weighted imaging, spin echo fMRI, turbo spin echo imaging, FLAIR, FLASH, and so forth.

In the case that slow gradients are played during the RF excitation, similar to PINS RF pulses, MultiPINS RF pulses may result in low BWTP, which in turn may produce sub-optimal slice excitation profiles compared to what may be achievable using MB RF pulses. This would generally occur for SMS acquisitions with low MB factors. Therefore, in some configurations, it may be desirable to have increased MB factors with reduced inter-slice distances (D), allowing for a desired BWTP to be achieved with a smaller number of larger gradient sub-pulses and thus a faster k-space traversal. As such, larger and hence longer gradient blips may be beneficial for MultiPINS RF excitation as they offer more time for MB mixing and hence more space for energy reductions. It is also contemplated that PINS RF pulses may be shortened to achieve high BWTP for low MB factors excitations. Specifically, parallel transmission methods could potentially be employed mitigate this issue.

Since PINS and MultiPINS RF pulse performance is mainly restricted by physiological gradient slew rate constraints, in some configurations, utilization of high performance head gradient systems, with increased achievable slew rates, may be beneficial to further improve MultiPINS efficiency, by shortening their lengthening factor. For example, in such case, a doubled gradient slew rate of say, 400 mT/m/s, may shorten gradient blips by a factor of $\sqrt{2}$ and therefore increase energy efficiency by the same amount. In addition, for further energy reduction of MultiPINS pulses, it is conceived that a variable rate selective excitation technique could also be employed on the MultiPINS RF pulse waveform, since either or both of MB and PINS pulses may very well benefit from this approach.

Figure 8:
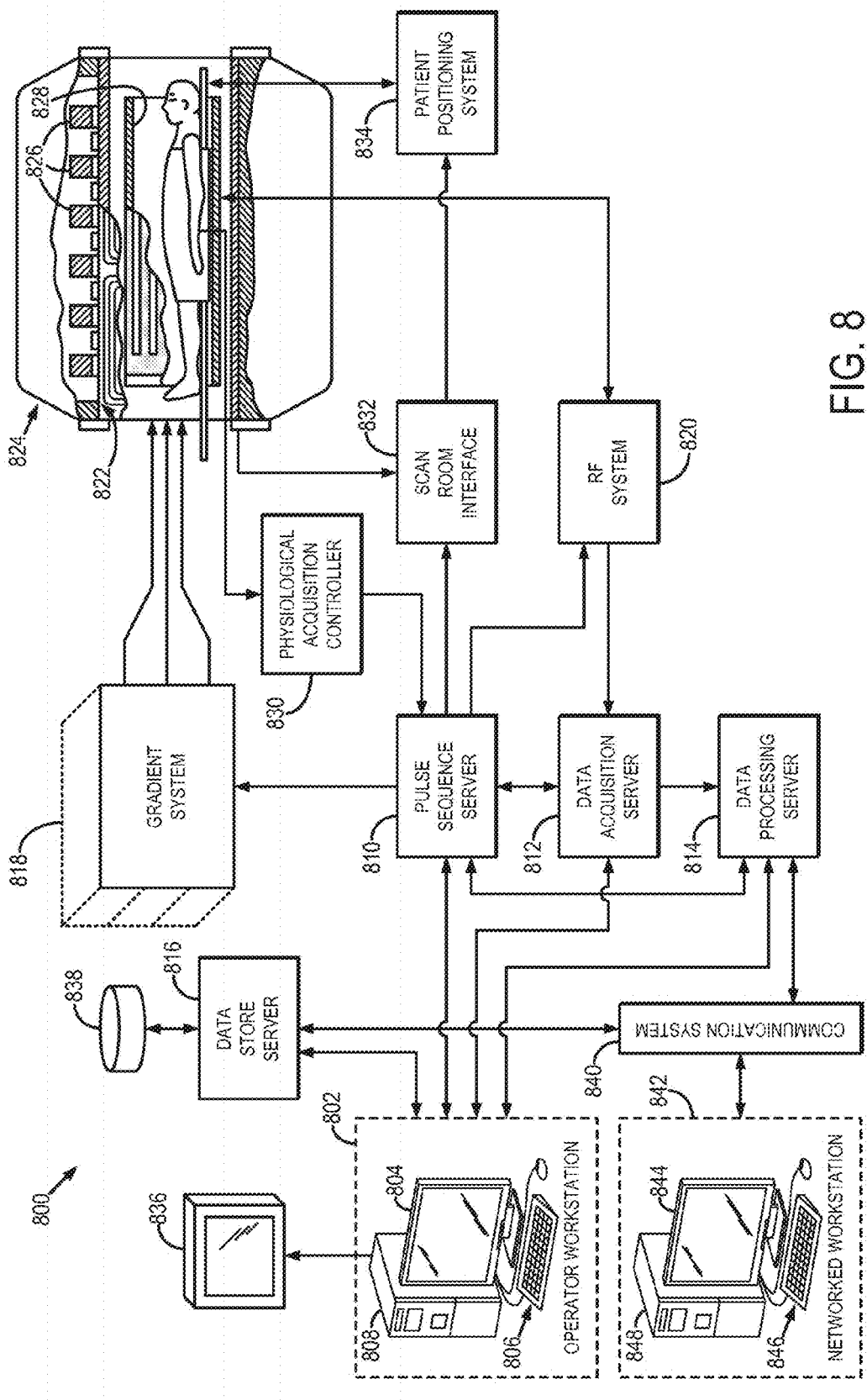
FIG. 8 is a block diagram of an example of a magnetic resonance imaging ("MRI") system.

Referring particularly now to FIG. 8, an example of a magnetic resonance imaging ("MRI") system 800 is illustrated. The MRI system 800 includes an operator workstation 802, which will typically include a display 804; one or more input devices 806, such as a keyboard and mouse; and a processor 808. The processor 808 may include a commercially available programmable machine running a commercially available operating system. The operator workstation 802 provides the operator interface that enables scan prescriptions to be entered into the MRI system 800. In general, the operator workstation 802 may be coupled to four servers: a pulse sequence server 810; a data acquisition server 812; a data processing server 814; and a data store server 816. The operator workstation 802 and each server 810, 812, 814, and 816 are connected to communicate with each other. For example, the servers 810, 812, 814, and 816 may be connected via a communication system 840, which may include any suitable network connection, whether wired, wireless, or a combination of both. As an example, the communication system 840 may include both proprietary or dedicated networks, as well as open networks, such as the internet.

The pulse sequence server 810 functions in response to instructions downloaded from the operator workstation 802 to operate a gradient system 818 and a radiofrequency ("RF") system 820. Gradient waveforms necessary to perform the prescribed scan are produced and applied to the gradient system 818, which excites gradient coils in an assembly 822 to produce the magnetic field gradients $G_x$, $G_y$, and $G_z$ used for position encoding magnetic resonance signals. The gradient coil assembly 822 forms part of a magnet assembly 824 that includes a polarizing magnet 826 and a whole-body RF coil 828.

RF waveforms are applied by the RF system 820 to the RF coil 828, or a separate local coil (not shown in FIG. 8), in order to perform the prescribed magnetic resonance pulse sequence. Responsive magnetic resonance signals detected by the RF coil 828, or a separate local coil (not shown in FIG. 8), are received by the RF system 820, where they are amplified, demodulated, filtered, and digitized under direction of commands produced by the pulse sequence server 810. The RF system 820 includes an RF transmitter for producing a wide variety of RF pulses used in MRI pulse sequences. The RF transmitter is responsive to the scan prescription and direction from the pulse sequence server 810 to produce RF pulses of the desired frequency, phase, and pulse amplitude waveform. The generated RF pulses may be applied to the whole-body RF coil 828 or to one or more local coils or coil arrays (not shown in FIG. 8).

The RF system 820 also includes one or more RF receiver channels. Each RF receiver channel includes an RF preamplifier that amplifies the magnetic resonance signal received by the coil 828 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (7);$$

and the phase of the received magnetic resonance signal may also be determined according to the following relationship:

$$\varphi = \tan^{-1}\left(\frac{Q}{I}\right). \quad (8)$$

The pulse sequence server 810 also optionally receives patient data from a physiological acquisition controller 830. By way of example, the physiological acquisition controller 830 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 810 to synchronize, or "gate," the performance of the scan with the subject's heart beat or respiration.

The pulse sequence server 810 also connects to a scan room interface circuit 832 that receives signals from various sensors associated with the condition of the patient and the magnet system. It is also through the scan room interface circuit 832 that a patient positioning system 834 receives commands to move the patient to desired positions during the scan.

The digitized magnetic resonance signal samples produced by the RF system 820 are received by the data acquisition server 812. The data acquisition server 812 operates in response to instructions downloaded from the operator workstation 802 to receive the real-time magnetic resonance data and provide buffer storage, such that no data is lost by data overrun. In some scans, the data acquisition server 812 does little more than pass the acquired magnetic resonance data to the data processor server 814. However, in scans that require information derived from acquired magnetic resonance data to control the further performance of the scan, the data acquisition server 812 is programmed to produce such information and convey it to the pulse sequence server 810. For example, during prescans, magnetic resonance data is acquired and used to calibrate the pulse sequence performed by the pulse sequence server 810. As another example, navigator signals may be acquired and used to adjust the operating parameters of the RF system 820 or the gradient system 818, or to control the view order in which k-space is sampled. In still another example, the data acquisition server 812 may also be employed to process magnetic resonance signals used to detect the arrival of a contrast agent in a magnetic resonance angiography ("MRA") scan. By way of example, the data acquisition server 812 acquires magnetic resonance data and processes it in real-time to produce information that is used to control the scan.

The data processing server 814 receives magnetic resonance data from the data acquisition server 812 and processes it in accordance with instructions downloaded from the operator workstation 802. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 814 are conveyed back to the operator workstation 802 where they are stored. Real-time images are stored in a data base memory cache (not shown in FIG. 8), from which they may be output to operator display 812 or a display 836 that is located near the magnet assembly 824 for use by attending physicians. Batch mode images or selected real time images are stored in a host database on disc storage 838. When such images have been reconstructed and transferred to storage, the data processing server 814 notifies the data store server 816 on the operator workstation 802. The operator workstation 802 may be used by an operator to archive the images, produce films, or send the images via a network to other facilities.

The MRI system 800 may also include one or more networked workstations 842. By way of example, a networked workstation 842 may include a display 844; one or more input devices 846, such as a keyboard and mouse; and a processor 848. The networked workstation 842 may be located within the same facility as the operator workstation 802, or in a different facility, such as a different healthcare institution or clinic.

The networked workstation 842, whether within the same facility or in a different facility as the operator workstation 802, may gain remote access to the data processing server 814 or data store server 816 via the communication system 840. Accordingly, multiple networked workstations 842 may have access to the data processing server 814 and the data store server 816. In this manner, magnetic resonance data, reconstructed images, or other data may exchanged between the data processing server 814 or the data store server 816 and the networked workstations 842, such that the data or images may be remotely processed by a networked workstation 842. This data may be exchanged in any suitable format, such as in accordance with the transmission control protocol ("TCP"), the internet protocol ("IP"), or other known or suitable protocols.

Figure 9:
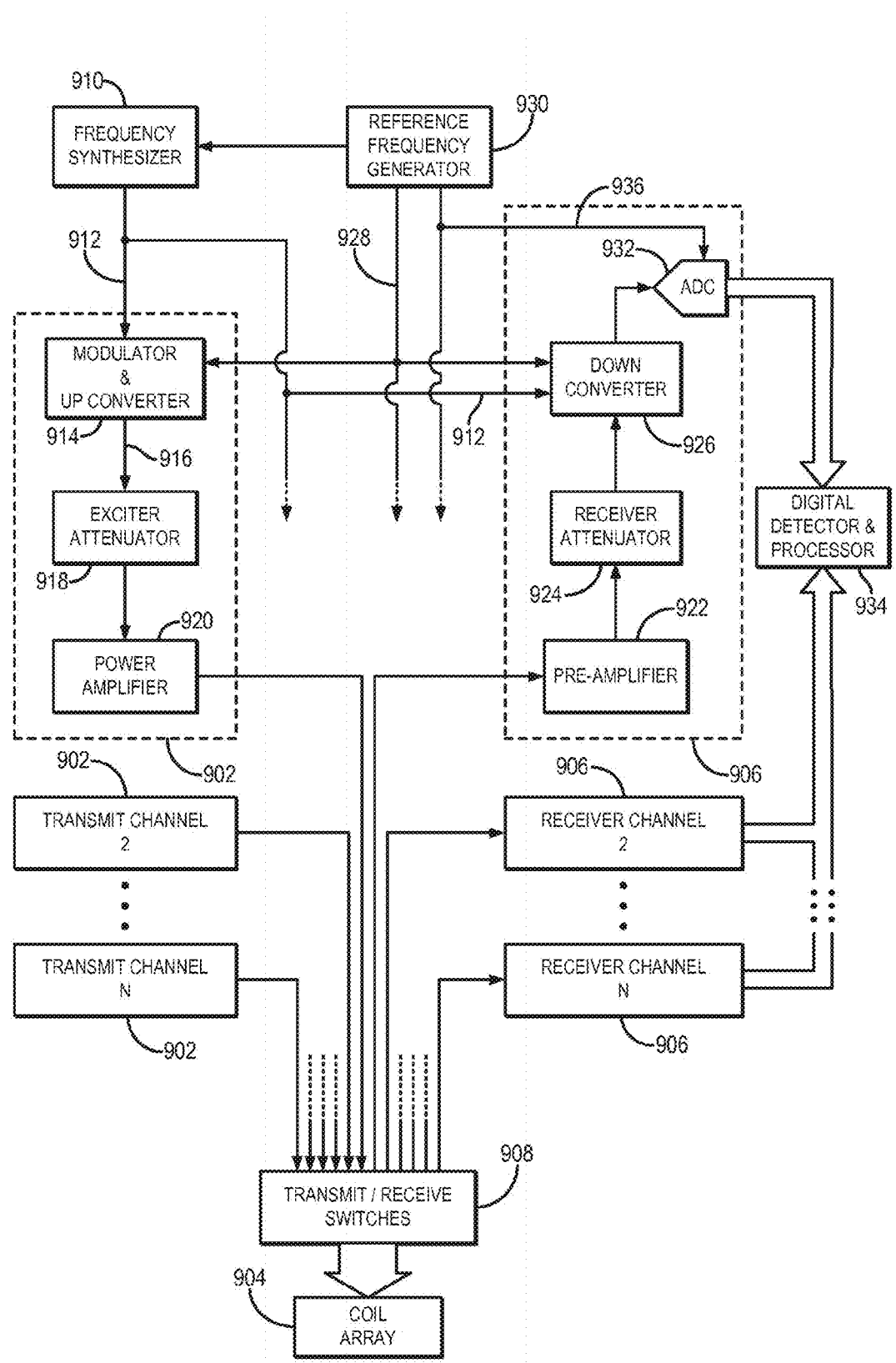
FIG. 9 is a schematic of a transmitter and receiver section of the MRI system of FIG. 8, for use in accordance with the present invention.

As shown in FIG. 8, the radiofrequency ("RF") system 820 may be connected to the whole body RF coil 828, or, as shown in FIG. 9, a transmission section of the RF system 820 may connect to one or more transmit channels 902 of an RF coil array 904 and a receiver section of the RF system 820 may connect to one or more receiver channels 906 of the RF coil array 904. The transmit channels 902 and the receiver channels 906 are connected to the RF coil array 904 by way of one or more transmit/receive ("T/R") switches 908. The receiver channel 906 may also be an assembly of coils separate from the transmit coil array. In such a configuration, the T/R switches 908 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 9, the RF system 820 includes one or more transmit channels 902 that produce a prescribed RF electromagnetic field. The base, or carrier, frequency of this RF field is produced under control of a frequency synthesizer 910 that receives a set of digital signals from the pulse sequence server 810. These digital signals indicate the frequency, amplitude, and phase of the RF carrier signal produced at an output 912. The RF carrier is applied to a modulator and, if necessary, an up converter 914 where its amplitude and phase is modulated in response to a signal, R(t), also received from the pulse sequence server 810. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 916 is attenuated by an attenuator circuit 918 that receives a digital command from the pulse sequence server 810. The phase of the RF pulse may also be altered using phase shifters (not shown). The modulated RF pulses are then applied to a power amplifier 920 that drives one element of the RF coil array 904, or several such elements that are electrically coupled. Multiple transmit channels then drive other elements of the multichannel transmit coil array.

The MR signal produced by the subject is picked up by the RF coil array 904 and applied to the inputs of the set of receiver channels 906. A preamplifier 922 in each receiver channel 906 amplifies the signal, which is then attenuated, if necessary, by a receiver attenuator 924 by an amount determined by a digital attenuation signal received from the pulse sequence server 810. The received signal is at or around the Larmor frequency, and this high frequency signal may be down converted in a two step process by a down converter 926. In an example of such a process, the down converter 926 first mixes the MR signal with the carrier signal on line 912 and then mixes the resulting difference signal with a reference signal on line 928 that is produced by a reference frequency generator 930. The MR signal is applied to the input of an analog-to-digital ("A/D") converter 932 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal may then be applied to a digital detector and signal processor 934 that produces in-phase (I) and quadrature (Q) values corresponding to the received signal. The resulting stream of digitized I and Q values of the received signal are output to the data acquisition server 812. In addition to generating the reference signal on line 928, the reference frequency generator 930 also generates a sampling signal on line 936 that is applied to the A/D converter 932.

As described above, a plurality of gradient coils in the gradient system 818 of the MRI system 800 may be controlled in accordance with the selected gradient waveform to establish, for example, a series of gradient blips. The RF system 820 may then be operated to generate, using the MultiPINS RF pulse waveform, an RF excitation field directed to a region of interest in a subject, and acquire MR image data therefrom. Applying the MultiPINS RF pulse waveform to generate the RF excitation field includes playing portions of the RF pulse waveform associated with the transformed MB pulse waveform during the gradient blips and playing out portions of the RF pulse waveform associated with the PINS pulse waveform in between the gradient blips, as described above.

Features suitable for combinations and sub-combinations would be readily apparent to persons skilled in the art upon review of the present application as a whole. The subject matter described herein and in the recited claims intends to cover and embrace all suitable changes in technology.

The invention claimed is:

1. A magnetic resonance imaging (MRI) system, the system comprising:
    a magnet system configured to generate a polarizing magnetic field about at least a portion of a subject arranged in the MRI system;
    a plurality of gradient coils configured to apply a time-varying gradient field to the polarizing magnetic field, the time-varying gradient field including a plurality of gradient blips;
    a radio frequency (RF) system configured to apply a RF excitation field to a region of interest in the subject and acquire MR image data therefrom; and
    a computer system programmed to:
        select a multiband (MB) RF pulse waveform that is associated with excitation of multiple different slice locations;
        select a power independent of a number of slices (PINS) RF pulse waveform that includes a plurality of sub-pulses spaced apart in time, the PINS RF pulse waveform being associated with a periodic excitation of the multiple different slice locations;

select a gradient waveform that defines a plurality of gradient blips to be played out between the plurality of sub-pulses in the PINS RF waveform;

generate a combined RF pulse waveform by combining the MB RF pulse waveform and the PINS RF pulse waveform by temporally overlapping the multiband RF pulse waveform with the PINS RF pulse waveform;

direct the plurality of gradient coils to generate a plurality of magnetic field gradient blips using the selected gradient waveform; and direct the RF system to generate an RF excitation field using the combined RF pulse waveform.

2. The MRI system of claim 1, wherein the computer system is programmed to:

transform the MB RF pulse waveform to produce a reshaped MB RF pulse waveform that follows a k-space traversal of the selected gradient waveform; and generate the combined RF pulse waveform by combining the reshaped MB RF pulse waveform and the PINS RF pulse waveform.

3. The MRI system of claim 2, wherein the computer system is programmed to transform the MB RF pulse waveform using a variable rate selective excitation technique.

4. The MRI system of claim 2, wherein the computer system is programmed to combine the reshaped MB RF pulse waveform and the PINS RF pulse waveform using a weighted combination that is weighted using a mixing ratio.

5. The MRI system of claim 4, wherein the computer system is programmed to perform the weighted combination in accordance with:

$$RF_3 = M*RF_1 + (1-M)*RF_2$$

where $RF_3$ is the combined RF pulse waveform, $RF_1$ is the reshaped MB pulse waveform, $RF_2$ is the PINS RF pulse waveform, and M is the mixing ratio.

6. The MRI system of claim 4, wherein the computer system is programmed to optimize the mixing ratio to minimize a specific absorption rate (SAR).

7. The MRI system of claim 4, wherein the computer system is programmed to optimize the mixing ratio to maximize a bandwidth of the combined RF pulse waveform.

8. The MRI system of claim 1, wherein the computer system is programmed to select a duration of the plurality of sub-pulses in the PINS RF waveform to minimize a specific absorption rate (SAR).

9. The MRI system of claim 1, wherein the computer system is programmed to select a duration of the plurality of sub-pulses in the PINS RF waveform to minimize off-resonance effects.

10. A method for controlling a magnetic resonance imaging (MRI) system to generate a radio frequency (RF) excitation field that simultaneously excites spins in multiple different slice locations, the method comprising:

a) selecting a multiband (MB) RF pulse waveform that is associated with excitation of multiple different slice locations;

b) selecting an RF pulse waveform that includes a plurality of sub-pulses spaced apart in time, the RF pulse waveform being associated with a periodic excitation of the multiple different slice locations;

c) selecting a gradient waveform that defines a plurality of gradient blips to be played out between the plurality of sub-pulses in the RF waveform selected in step b);

d) generating a combined RF pulse waveform by combining the MB RF pulse waveform selected in step a) with the RF pulse waveform selected in step b) by temporally overlapping the MB RF pulse waveform selected in step a) with the RF pulse waveform selected in step b); and e) directing an MRI system to generate an RF excitation field that simultaneously excites spins in the multiple different slice locations using the combined RF pulse waveform generated in step d) and the gradient waveform selected in step c).

11. The method of claim 10, wherein step d) includes transforming the MB RF pulse waveform to produce a reshaped MB RF pulse waveform that follows a k-space traversal of the selected gradient waveform, and combining the reshaped MB RF pulse waveform with the RF pulse waveform selected in step b).

12. The method of claim 11, wherein step d) includes transforming the MB RF pulse waveform using a variable rate selective excitation technique.

13. The method of claim 11, wherein step d) includes combining the reshaped MB RF pulse waveform and the RF pulse waveform selected in step b) using a weighted combination that is weighted using a mixing ratio.

14. The method of claim 13, wherein the weighted combination includes performing the following:

$$RF_3 = M*RF_1 + (1-M)*RF_2$$

where $RF_3$ is the combined RF pulse waveform, $RF_1$ is the reshaped MB pulse waveform, $RF_2$ is the RF pulse waveform selected in step b), and M is the mixing ratio.

15. The method of claim 13, wherein step d) includes optimizing the mixing ratio to minimize a specific absorption rate (SAR).

16. The method of claim 13, wherein step d) includes optimizing the mixing ratio to maximize a bandwidth of the combined RF pulse waveform.

17. The method of claim 10, wherein step b) includes selecting a duration of the plurality of sub-pulses to minimize a specific absorption rate (SAR).

18. The method of claim 10, wherein step b) includes selecting a duration of the plurality of sub-pulses to minimize off-resonance effects.

19. The method of claim 10, wherein the RF pulse waveform selected in step b) is a power independent of a number of slices (PINS) RF pulse waveform.

\* \* \* \* \*